United States Patent
Piasecki et al.

(10) Patent No.: US 10,348,139 B2
(45) Date of Patent: Jul. 9, 2019

(54) CONFIGURABLE WIRELESS CHARGING TRANSMIT AND RECEIVE MONITORING DEVICE

(71) Applicant: WITRICITY CORPORATION, Watertown, MA (US)

(72) Inventors: Douglas Piasecki, Austin, TX (US); Zhong You, Austin, TX (US)

(73) Assignee: WITRICITY CORPORATION, Watertown, MA (US)

( * ) Notice: Subject to any disclaimer, the term of this patent is extended or adjusted under 35 U.S.C. 154(b) by 125 days.

(21) Appl. No.: 15/719,880

(22) Filed: Sep. 29, 2017

(65) Prior Publication Data

US 2019/0103771 A1    Apr. 4, 2019

(51) Int. Cl.
*H02J 50/60* (2016.01)
*H02J 7/02* (2016.01)
(Continued)

(52) U.S. Cl.
CPC .............. *H02J 50/60* (2016.02); *H02J 7/025* (2013.01); *H02J 50/10* (2016.02); *H03K 3/017* (2013.01); *H04L 25/4902* (2013.01)

(58) Field of Classification Search
CPC ........... H02J 50/60; H02J 50/10; H02J 7/025; H03K 3/017; H04L 25/4902
See application file for complete search history.

(56) References Cited

U.S. PATENT DOCUMENTS

| 4,644,253 A | 2/1987 | Libert |
| 5,502,412 A | 3/1996 | Choi et al. |

(Continued)

FOREIGN PATENT DOCUMENTS

| WO | 2015009328 A1 | 1/2015 |
| WO | 2017019294 A1 | 2/2017 |

OTHER PUBLICATIONS

Niayak et al., Shunt-Based Ground Fault Protection for Inverters, Texas Instruments Incorporated, TIDU56A, 51 pgs. Aug. 2015.
(Continued)

*Primary Examiner* — Carlos Amaya

(57) ABSTRACT

A configurable transmit/receive multiplexed coil monitoring (CMCM) device is provided having a plurality of dual function I/O connections connectable to a plurality of coils. The CMCM device is configurable to selectively drive AC transmit signals to any of the plurality of dual function I/O connections, while simultaneously monitoring voltage and phase information received as AC voltages at the dual function I/O connections in a multiplexed manner. The CMCM device is further configured such that while a selected I/O connection is selected to receive voltage and phase information from a particular I/O connection, no AC transmit signal can be driven to that selected particular I/O connection. Embodiments may include a multiplexer and one or more receive circuits configured to receive and digitalize received AC signals for processing by a digital signal processor. Embodiments may also include selectable Class-D drivers connected to the plurality of I/O connection, wherein each Class-D driver may be configured to receive pulse width modulation (PWM) signals from a PWM circuit for amplification and output as an AC transmit signal.

20 Claims, 8 Drawing Sheets

(51) Int. Cl.
*H04L 25/49* (2006.01)
*H03K 3/017* (2006.01)
*H02J 50/10* (2016.01)

(56) References Cited

U.S. PATENT DOCUMENTS

| | | | |
|---|---|---|---|
| 5,876,425 | A | 3/1999 | Gord et al. |
| 6,288,591 | B1 | 9/2001 | Riccio |
| 6,437,627 | B1 | 8/2002 | Tran et al. |
| 6,536,726 | B1 | 5/2003 | Hirst |
| 6,664,822 | B2 | 12/2003 | Watabe |
| 6,724,223 | B2 | 4/2004 | Ichiguchi et al. |
| 6,967,518 | B2 | 11/2005 | Giacomini et al. |
| 7,015,728 | B1 | 3/2006 | Solic |
| 9,154,002 | B2 | 6/2015 | Norconk et al. |
| 9,384,885 | B2 | 4/2016 | Karalis et al. |
| 9,496,741 | B2 | 11/2016 | Lee et al. |
| 2002/0125920 | A1 | 9/2002 | Stanley |
| 2009/0001932 | A1 | 1/2009 | Kamijo et al. |
| 2012/0176162 | A1 | 7/2012 | Heck |
| 2013/0026849 | A1 | 1/2013 | Ohta et al. |
| 2013/0033118 | A1 | 2/2013 | Karalis et al. |
| 2013/0249479 | A1 | 9/2013 | Partovi |
| 2013/0285604 | A1 | 10/2013 | Partovi |
| 2014/0015478 | A1 | 1/2014 | Von Novak |
| 2014/0312708 | A1 | 10/2014 | Takahashi |
| 2015/0109000 | A1 | 4/2015 | Sieber et al. |
| 2015/0229135 | A1 | 8/2015 | Porat et al. |
| 2015/0326143 | A1 | 11/2015 | Petras et al. |
| 2016/0187520 | A1* | 6/2016 | Widmer .............. G01V 3/101 324/227 |
| 2016/0352134 | A1 | 12/2016 | Pawar et al. |
| 2016/0352152 | A1 | 12/2016 | Karalis et al. |
| 2017/0025904 | A1 | 1/2017 | Roy et al. |
| 2017/0126069 | A1 | 4/2017 | Martin |

OTHER PUBLICATIONS

ST Microelectronics NV, High-side current sense amplifier, 17 pgs. Nov. 6, 2015.
Ho et al., Energy Transfer for Implantable Electronics in the Electromagnetic Midfield, Progress in Electromagnetics Research, vol. 148, 151-158, 8 pgs. 2014.
Kim et al., Wireless Power Transfer to a Cardiac Implant, Applied Physics Letters, American Institute of Physics, http://dx.doi.org/10.1063/1.4745600, 5 pgs. Aug. 13, 2012.
Industry Canada, Wireless Power Transfer Devices (Draft), Spectrum Management and Telecommunications, Radio Standards Specification, RSS-216, Issue 2, 18 pgs. 2015.
Alliance for Wireless Power, A4WP Wireless Power Transfer System Baseline System Specification (BSS), A4WP-S-0001 v1.3, Version 1.3, 108 pgs. Nov. 5, 2014.
Forstner, Simon, TI Designs: Verified Design High Voltage 12V-400V DC Current Sense Reference Design, Texas Instruments Incorporated, TIDU833, 16 pgs. Mar. 2015.
Maxim Integrated Products, Add High Voltage Capability to the MAX471/MAX472 High-Side Current Sense Amplifiers, Application Note 1934, 3 pgs. Mar. 14, 2003.
Williams, Jim, Bias Voltage and Current Sense Circuits for Avalanche Photodiodes, Linear Technology, Application Note 92, 32 pgs. Nov. 2002.
Regan et al., Current Sense Circuit Collection Making Sense of Current, Application Note 105, Linear Technology, 118 pgs. Dec. 2005.
Lu et al., Wireless Charging Technologies: Fundamentals, Standards, and Network Applications, IEEE Communications Surveys and Tutorials, To Appear, arXiv:1509.00940v2 [cs.NI], 40 pgs. Nov. 14, 2015.
InTech; Hoang, Huy; Bien, Franklin; "Maximizing Efficiency of Electromagnetic Resonance Wireless Power Transmission Systems with Adaptive Circuits"; South Korea Jan. 25, 2012.
Hindawi Publishing Corporation, International Journal of Antennas and Propagation; Luo, Yanting; Yang, Yongmin; Chen, Suiyu; Wen, Xisen; "A Frequency-Tracking and Impedance-Matching Combined System for Robust Wireless Power Transfer". Jan. 29, 2017.
Department of Electronics and Radio Engineering, Kyung Hee University; Lee, Jong-Wook; Duong, Thuc Phi; "A Dynamically Adaptable Impedance-Matching System for Midrange Wireless Power Transfer with Misalignment"; South Korea Jul. 27, 2015.
Energies; Lu, Yan; Dongsheng, Brian Ma; "Wireless Power Transfer System Architecture for Portable or Implantable Applications" Dec. 19, 2016.
The University of Tokyo; Kato, Masaki; Imura, Takehiro; Hori, Yoichi; "Study on Maximize Efficiency by Secondary Side Control Using DC-DC Converter in Wireless Power Transfer via Magnetic Resonant Coupling"; Barcelona, Spain. Nov. 17, 2013.
Georgia Institute of Technology; Rincon-Mora, Gabirel Alfonso; "Current Efficient, Low Voltage, Low Drop-out Regulators". Nov. 1, 1996.
SMPS European Application Lab, International Rectifier; Giacomini, Davide; Chine, Luigi; "A novel high efficient approach to input bridges"; Nuremberg, Germany. May 27, 2008.
Piers Proceedings; Waters, B. H.; Sample, A. P.; Smith, J. R.; "Adaptive Impedance Matching for Magnetically Coupled Resonators"; Moscow, Russia. Aug. 19, 2012.
Van Ray, Roland; Richtek Technologies Corporation; "Introduction to RT 1650 Wireless Power Receiver"; Hsinchu, Taiwan, R.O.C.; Sep. 2015.
Kim, Jinwook et al.; IEEE Transactions on Industrial Electronics; "Analysis of Capacitive Impedance Matching Networks for Simultaneous Wireless Power Transfer to Multiple Devices"; vol. 62, No. 5, May 2015.
Huwig, Dominik et al.; RRC power solutions GmbH; "Digitally Controlled Rectifier for Wireless Power Receivers"; Homburg, Germany.
Fu, Minfan et al.; University of Michigan-Shanghai Jiao Tong University Joint Institute; "A 13.56 MHz Wireless Power Transfer System Without Impedance Matching Networks"; Shanghai, China.
Texas Instruments Incorporated; "LM5113 100 V 1.2-A / 5-A, Half-Bridge Gate Driver for Enhancement Mode GaN FETs"; SNVS725G Jun. 2011—Revised Jan. 2016.
PCT: International Search Report and Written Opinion of PCT/US18/53699 (related application), Dec. 13, 2018, 8 pgs.

* cited by examiner

CONFIGURABLE WIRELESS CHARGING TRANSMIT AND RECEIVE MONITORING DEVICE

TECHNICAL FIELD

This application relates in general to wireless transfer systems and, more particularly to devices utilized to help monitor and control Wireless Power Transfer (WPT) systems.

BACKGROUND

Wireless charging, also known as Wireless Power Transfer (WPT), is a technology that generally enables a power source to transmit electromagnetic energy across a gap to an electrical load without interconnecting electrical connections. Two types of WPT are radio frequency (RF) based wireless charging and non-radiative or coupling-based wireless charging. RF wireless charging adopts electro-magnetic waves, typically RF waves or microwaves, as a medium to deliver energy in the form of radiation. Non-radiative or coupling based wireless charging is generally based on the coupling of an oscillating magnetic-field established between two coils spaced a relatively small distance apart.

Wireless power transmission systems often include two major components being a power transmitter unit (PTU) and a power receiver unit (PRU). The PTU includes components that supply power to a transmitter resonator coil, which establishes an oscillating magnetic field. The PRU includes a receiving resonator coil that can be magnetically coupled to the transmitter resonator coil. The PRU converts the received alternating magnetic field into electrical energy that can be used to energize or charge a load, such as a battery in a mobile electronic device, a medical device, an electric vehicle or any other apparatus that includes an energy storage device or operates based on wirelessly received energy. In various types of WPT systems there may be a wireless communication path between the PTU and the PRU in order to share static and dynamic charging parameters before and during the time the PTU transfers energy to the PRU.

When a PTU is preparing to or transmitting energy to the PRU, the PTU may want to monitor various aspects of its transmitter resonator coil prior to and during the alternating magnetic coupling with the receiving resonator coil of the PRU. In particular, it may be useful for the PTU to determine prior to transmission whether there is a foreign object proximate to the transmitter resonating coil or between the transmitter and receiver resonating coils. It may also be useful for the PTU to be able to recognize the relative positions of the PTU's transmitting and PRU's receiving coils in order to determine whether an adjustment for a minor misalignment was made, or to not transfer energy wirelessly due to a major misalignment. Additionally, the PTU may want to monitor for a change in the foreign object detection status, relative position status or power transfer efficiency during the transfer of power between the transmitting and receiving coils.

What is needed is a PTU or PRU system that has a device incorporated therein that can be configured to transmit a defined magnetic signal on one or more coils in an array of coils while simultaneously analyzing received magnetic energy on other coils in the array of coils in order to help determine whether a conductive foreign object has become present on the PTU's main transmission coil or aid in the determination of the position of a PRU's receiving coil relative to the PTU's main transmission coil.

SUMMARY

Embodiments provide a device or semiconductor device that may be incorporated into a PTU or PRU system. The device may be configured to enable transmission of a defined magnetic signal on one or more coils in an array of coils while simultaneously analyzing received magnetic energy on other coils in the array of coils in order to help determine whether a foreign object, such as a conductive object, is or has become present within any magnetic fields created by the one or more coils in the array of coils.

For example, an embodiment may provide an integrated circuit comprising N shared input/output (I/O) connections, wherein each of the I/O are configured to connect to N respective coils, wherein N is a positive integer greater than 1. The embodiment may further include an analog multiplexer having N mux inputs each connected to a respective one of the N I/O connections, the analog multiplexer being configured to direct an AC input signal from a selected one of the N mux inputs to a mux output when the analog multiplexer is enabled. A receiver circuit is included and configured to receive the AC input signal and convert the AC input signal into a digital signal. The digital signal processor (DSC) is included and configured to process the digital signal in accordance with the predetermined configuration and then output processed data. There may also be a pulse width modulation (PWM) generator included that is configured to output PWM signals in accordance with a PWM control signal. Additionally, an embodiment may include N gate drivers connected such that each respective gate driver receives a PWM signal from the PWM generator and a respective gate driver enable signal. Each gate driver being configured to transmit an AC signal relative to the PWM signal only when enabled by the respective gate driver enable signal. The AC signal is provided to the respective one of the N I/O connections. The embodiment may further include a control portion configured to provide mux enable and mux select signals to the analog multiplexer and to provide respective gate driver enable signals to the respective N gate drivers in accordance with the predetermined configuration, such that when the analog multiplexer is not enabled by the mux enable signal any of the N gate drivers can be enabled by the respective gate driver enable signal, and such that when the analog multiplexer is enabled by the mux enable signal and the mux select signal designates the selected one of the N mux inputs then any of the N gate drivers can be enabled by the respective gate driver enable signal, except for one of the N gate drivers that is respective to the selected one of the N mux circuits.

Additional embodiments provide a configurable transmit/receive multiplexed coil monitoring (CMCM) device that has a plurality of dual function I/O connections connectable to a plurality of coils. The CMCM device is configurable to selectively drive AC transmit signals to any of the plurality of dual function I/O connections, while simultaneously monitoring voltage and phase information received as AC voltages at the dual function I/O connections in a multiplexed manner. The CMCM device may be further configured such that while a selected I/O connection is selected to receive voltage and phase information from a particular I/O connection, no AC transmit signal can be driven to that selected particular I/O connection. Embodiments may include a multiplexer and one or more receive circuits configured to receive and digitize received AC signals for processing by a digital signal processor. Additionally the output driver circuits may include selectable Class-D drivers connected to the plurality of I/O connection wherein each Class-D driver may be configured to receive pulse width modulation (PWM) signals from a PWM circuit.

BRIEF DESCRIPTION OF THE DRAWINGS

For a more complete understanding, reference is now made to the following description taken in conjunction with the accompanying Drawings in which.

DETAILED DESCRIPTION

Figure 1:
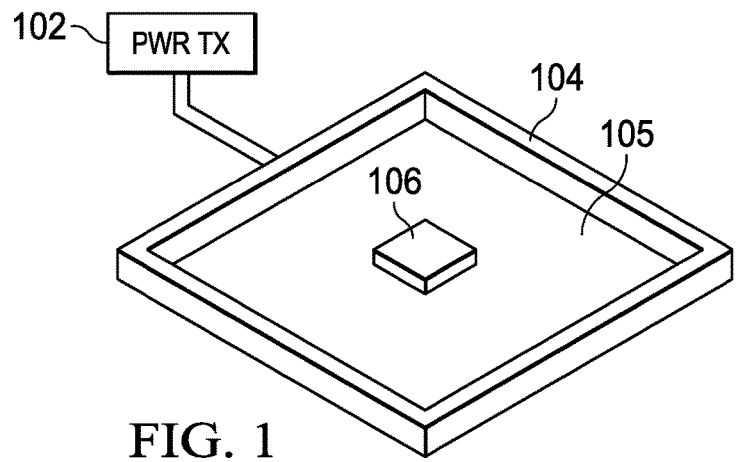
FIG. 1 illustrates a diagrammatic view of a charging system for a wireless power transfer system.

Referring now to the drawings, wherein like reference numbers are used herein to designate like elements throughout, the various views and embodiments of the configurable wireless charging transmit and receive monitoring device are illustrated and described, and other possible embodiments are described. The figures are not necessarily drawn to scale, and in some instances the drawings have been exaggerated and/or simplified in places for illustrative purposes only. One of ordinary skill in the art will appreciate the many possible applications and variations based on the following examples of possible embodiments.

Referring now to FIG. 1, a basic diagram view of a Wireless Power Transfer (WPT) system is illustrated. A power transmitter 102 is shown. The power transmitter 102 generates an alternating current on a transmission coil 104, which is placed on or in proximity to a planar surface 105. A device 106 is placed or positioned within a magnetic field created by the transmission coil 104. The device 106 is to be charged or is to receive energy wirelessly from the transmission coil 104. The device 106 includes a receiving coil (not shown). The receiving coil of device 106 is coupled with the magnetic field created by the transmission coil 104 in order to wirelessly obtain energy from the magnetic field for use by the device 106.

Figure 2:
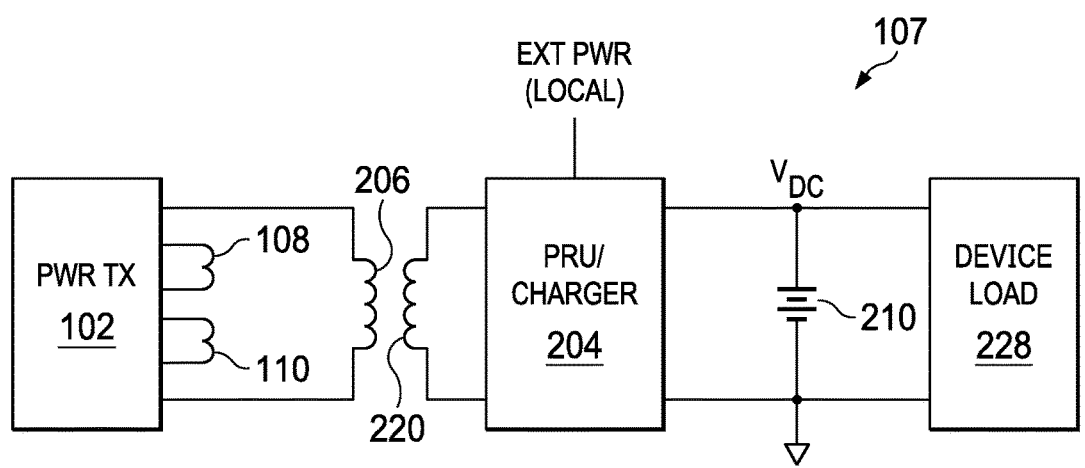
FIG. 2 illustrates a simplified diagrammatic view of a wireless power transmitting and receiving system with a battery and device load.

In FIG. 2, a block diagram of an overall WPT system 107 is depicted. This WPT system 107 includes a power transmitter 102, which may also in some embodiments be referred to as a Power Transmitter Unit (PTU). The PTU 102 drives the main transmission coil 206. The PTU also may selectively drive one or more detection coils 108, 110. In addition, the PTU 102 may sense or receive coupled magnetic energy from the detection coils 108, 110, one at a time, in a multiplexed manner in order to monitor initial and ongoing attributes of the transmission coil 206 and the coupling of the transmission coil with a receiving coil 220. In various embodiments, the one or more detection coils 108, 110 may be in an array of coils configured such that while some of the coils are transmitting magnetic energy, others receive coupled magnetic energy and provide the resulting coupled energy for use in determining whether a metallic foreign object or an additional PRU is now present on or near the array of coils.

The WPT system 107 has associated with it a receiving coil 220 that may be magnetically coupled with the transmission coil 206 when placed in its proximity. The receiving coil 220, when coupled with the transmission coil 206, receives a signal from the PTU 102. The WPT system 107 further may include a Power Receiving Unit (PRU) 204 that is operable to convert the magnetically coupled signal received on the receiving coil 220 to an output DC voltage that can be stored in a battery 210 and/or which can be used to drive a device load 228. Thus, by placing the receiving coil 220 in the resonant magnetic field of the transmitting coil 206, energy is received by the PRU 204 to charge the battery 210 and/or for use by device load 228.

Figure 3:
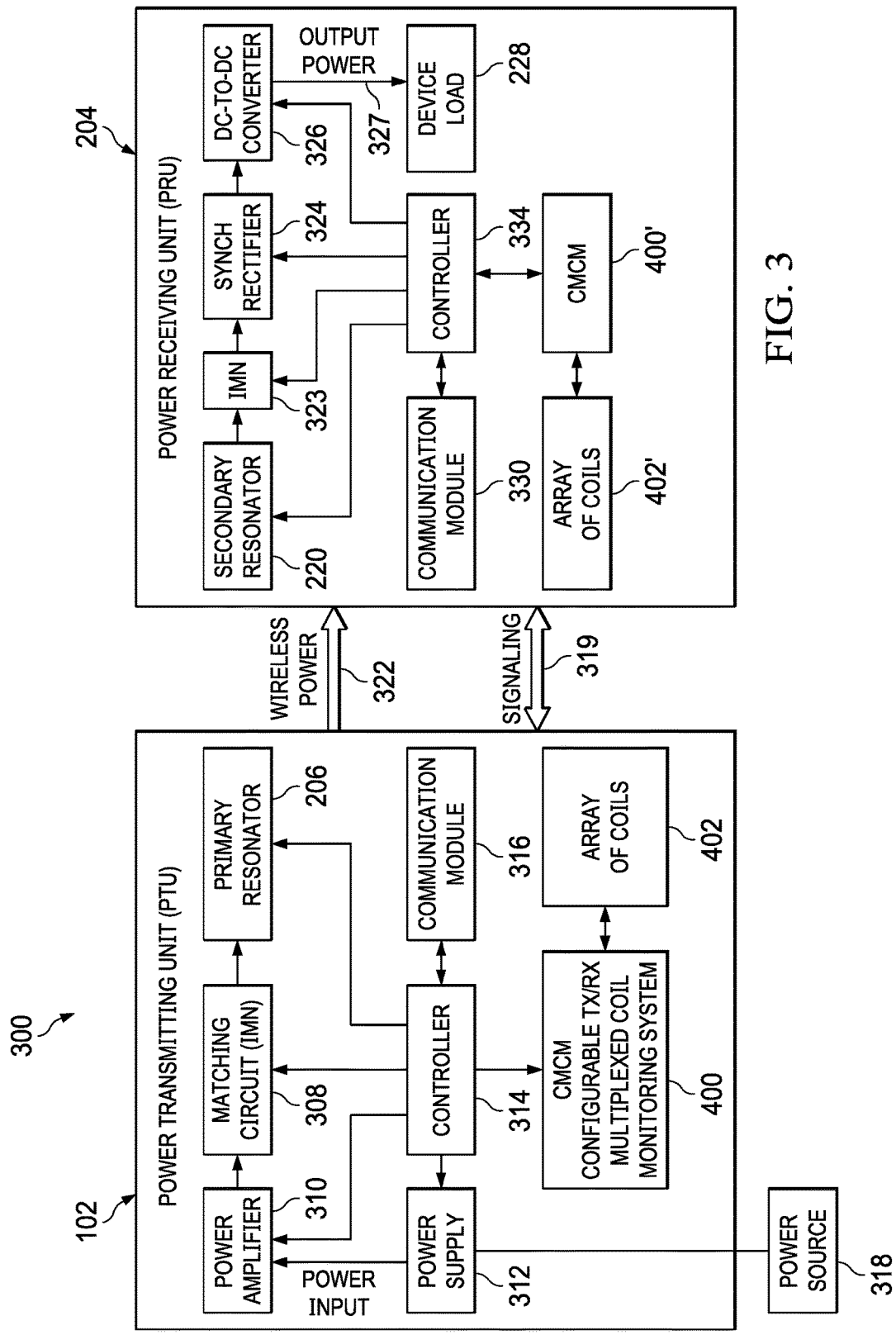
FIG. 3 illustrates a block diagram of a power transmitting unit and a power receiving unit interfaced with each other as a system that provides an overall wireless power transfer system.

FIG. 3 illustrates a block diagram of an embodiment of a Wireless Power Transfer (WPT) system 300 that includes a PTU 102 that interfaces with a PRU 204. Here, wireless power may be transferred from the PTU 102 to the PRU 204.

The PTU 102 includes a transmitting or main charging coil 206, which generates an alternating magnetic field to wirelessly transmit power 322 to the PRU 204. The main charging coil 206 may also be referred to as a primary resonator 206. A variable impedance matching circuit 308 is positioned to interface between a power amplifier 310 and the main charging coil 208. A power supply 312 may be connected to an external power source 318. The power supply 312 is configured to provide power input to the power amplifier 310.

A Configurable transmit/receive Multiplexed Coil Monitoring (CMCM) device 400 is connected to a plurality or an array of detection coils 402. As described herein below, these coils can either be utilized in a receive mode or a driven/transit mode. There may be a number N of detection coils 402 in the array of coils, where N is a positive integer greater or equal to 2. The detection coils 402 may be located in a plane proximate to and about the primary resonator or main charging coil 206. The CMCM device 400 is configurable to receive in a multiplexed manner inputs from a number of the plurality of detection coils 402, while simultaneously driving one or more of the plurality of detection coils 402 so as to transmit an alternating magnetic field. The received inputs represent magnetic couplings from magnetic energy transmitted from simultaneously driven coils in the array of coils 402. The CMCM device is further configured such that it cannot transmit to or drive a selected one of the plurality of detection coils 402 at the same time that it receives an input from the same selected detection coil.

Additionally, the CMCM device 400 comprises digital signal processing (DSP) circuitry that is configurable to analyze the phase and voltage of each of the multiplexed inputs received from the plurality of detection coils 402 and compare the results with previous results of the multiplexed inputs from selected coils in the array of coils 402. Such previous results may be calibration values to represent a state of a "lack" of foreign objects in the array. The DSP comparisons or relative determined phases and/or voltages of the multiplexed inputs from the plurality of detection coils may be provided as digital output from the CMCM device 400 to the controller 314 to use, for example, to determine whether an unexpected conductive object (i.e., a foreign object) is on or proximate to the main charging coil. In some embodiments, the controller 314 can perform further processing of the CMCM device 400 output. For example, the controller 314 can keep an ongoing count of signal comparison results that are outside of a predetermined ratio and provide an alert when the ongoing count surpasses a predetermined threshold.

The controller 314 is provided to control the power supply 312, the power amplifier 310, the matching circuit 308, the CMCM 400, and in some embodiments the primary resonator coil 206. The controller 314 interfaces with a communication module 316 in order to communicate with the PRU 204 over a bidirectional wireless signal path 319.

The PRU 204 includes a secondary resonator coil 220 that interfaces and couples with the primary resonator 206 of the PTU 102 via the wireless power path 322. The output of the secondary resonator 220 is input to a variable impedance matching network (IMN) 323, and then to the input of a synchronous rectifier 324 for rectifying the output to a DC level, which is then input to a DC-to-DC converter 326. The DC-to-DC converter 326 outputs the output power 327 of the PRU 204, which can then be input into the device load 228. It should be understood that multiple loads can be interfaced with the DC-to-DC converter 326.

A communication module 330 of the PRU 204 is operable to interface with the communication module 316 of the PTU 102 via a wireless signaling path 319. The controller 334 is provided on the PRU 204 for interfacing with the secondary resonator 220, the impedance matching network 323, the rectifier 324, and the DC-to-DC converter 326.

In some embodiments, a CMCM device 400' is connected to a plurality or an array of detection coils 402' in the PRU 204 and utilized in a manner similarly described for the CMCM device 400 and detection coils 402 in the PTU 102.

The communications modules 316 and 330 provide feedback signaling between the PRU 204 and the PTU 102 for the purpose of helping to control the charging operation, to provide an alert about a foreign object presence between the PTU 102 and the PRU 204. In various embodiments, the wireless power 322 is generated at approximately 6.78 MHz or 85 kHz. The communication on the signaling path 319 can be facilitated, for example, over an out-of-band communication path for control signaling and operates at the 2.4 GHz Industrial Scientific Medical (ISM) band. For example, this out-of-band communication path can be via Bluetooth (BLE), WiFi, or radio. Alternatively, load modulation can be provided, which is referred to as "in-band communication" and provided by inducing a load on the secondary resonator coil 220. Out-of-band communication or signaling can be a wireless communication between the PTU 102 and the PRU 204, signaling 319, in a frequency band that is outside of the frequency band of the wireless power path 322. For example, the out-of-band communication or signaling could be outside of the established 85 kHz band for automobiles or outside the 6.78 MHz band for consumer equipment (CE). The out-of-band signaling 319 can be bi-directional between the PTU 102 and the PRU 204. In-band communication or signaling may be provided in the direction of the wireless power transfer 322 from the PTU 102 to the PRU 204 as a signal modulated on the on the magnetic resonance in-band signal, for example about 85 kHz for automotive WPT systems or a signal of about 80 kHz to about 400 kHz, or about 6.78 MHz, for consumer equipment (CE) related WPT systems.

Embodiments of the PTU 102 can operate in multiple functional states. One functional state is the configuration state, in which the PTU 102 does a self-check wherein basic functionality of the various components of the PTU 102 are checked for being in communication with the controller 314. Another state is the PTU power save state, in which the PTU 102 periodically detects changes in impedance at the primary resonator 206. Yet another functional state is the PTU low power state, in which the PTU 102 beacons for and/or establishes a data connection with one or more PRU(s) 204. Another functional state is the PTU power transfer state, in which the PTU 102 can regulate power transfer across the wireless power path 322. Another state is the local fault state, which happens when the PTU 102 experiences any local fault conditions such as over-temperature. Yet another important state is the PTU latching fault state, which happens when foreign objects, such as unexpected conductive items, are detected on or in close proximity to the primary resonator 206, or when a system error or other failures are detected.

The PRU 204 also has a number of operational or functional states. One is the null state, wherein the PRU 204 is under-voltage; one is the PRU boot state, wherein the PRU 204 establishes a communication link with the PTU 102; one is the PRU ON state, wherein wireless power is transferred from the PTU 102 to the PRU 204; one is the PRU system error state, which occurs upon detection of an over-voltage, over-current, or over-temperature alert, or other error necessitating a power shut down of the all or specific parts of the PRU 204.

Various embodiments of wireless power transmission systems may use different wireless communication protocols for signaling 319 between the communication modules of the PTU and PRU. For example, one possible communication protocol that can be used to support wireless charging functionality of a wireless power transmission system is a Bluetooth Low Energy (BLE) link. The BLE link can be used to communicate control of power levels, identification of valid loads, shut down instructions to protect non-compliant devices or rogue object detection (i.e., foreign object detection). There can be three steps in the communication protocol, the first being device detection, the second being information exchange, and the third being charging control. With respect to device detection, the PTU 102 can beacon power until the PRU 104 broadcasts advertisements indicating that it is present. The PTU 102, upon receipt of an advertisement can reply to the PRU with a connection request. The information exchange allows the PTU 102 and PRU 204 to exchange their static and dynamic parameters. Static parameters may include, for example, PTU and PRU identification data, the communication protocol to be used between the PTU and PRU, the resonance frequency band for the wireless power transfer 322, and the channel to use for out-of-band communication. Dynamic parameters may include the variable power/wattage setting for the PTU to transmit the wireless power or feedback on the amount of power the PRU wants to receive. The charging control is initiated when the PTU 102 can provide power to meet the demand requested from PRU 204, or when the PRU 204 is authorized to receive energy.

Figure 4:
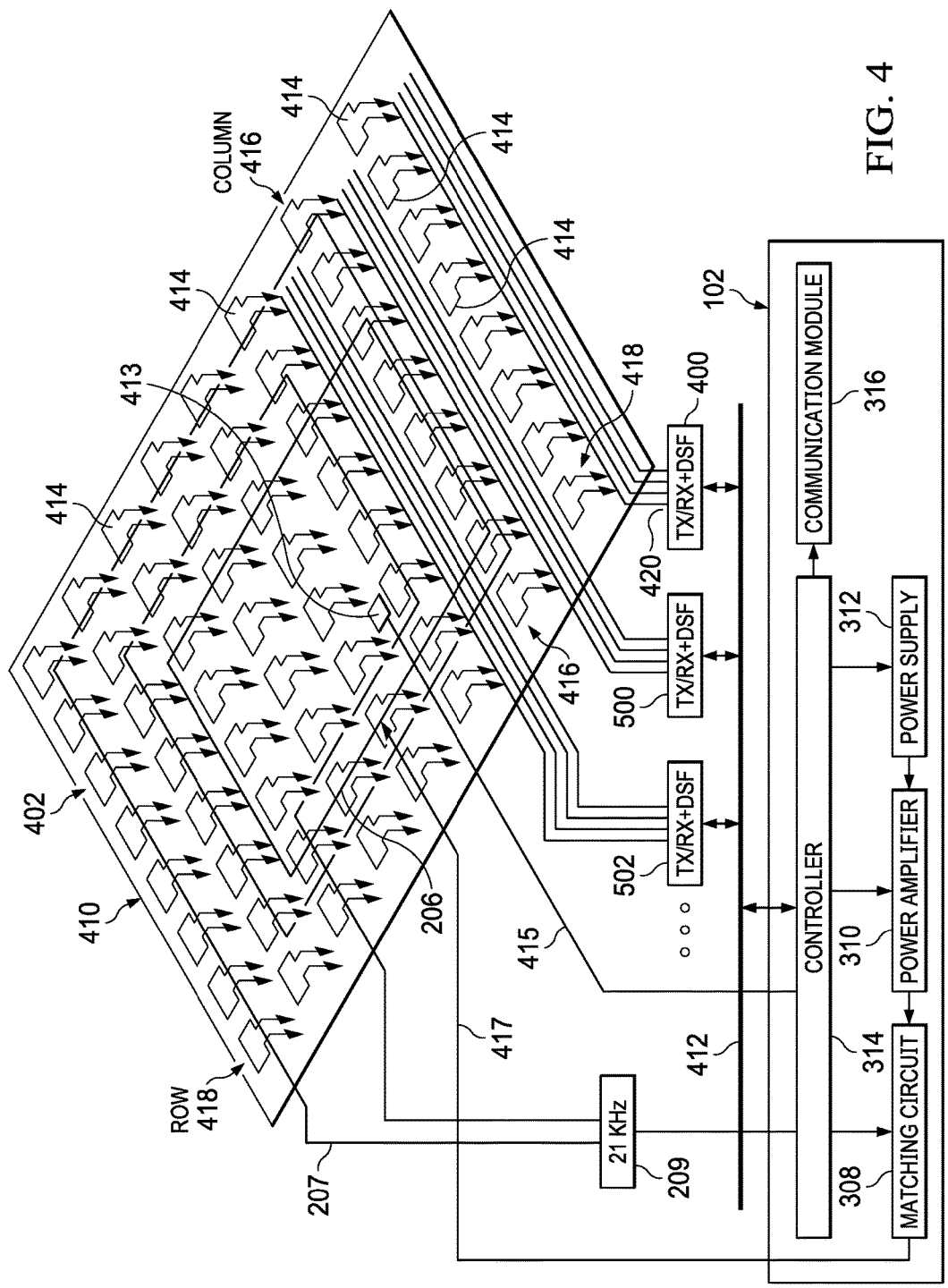
FIG. 4 illustrates a diagrammatic view of an embodiment of a wireless power transmission unit (PTU) connected to an associated primary resonator coil, a plurality of Configurable TX/RX Multiplexed Coil Monitoring (CMCM) devices, and an array of detection coils.

Referring now to FIG. 4, a diagrammatic view of an embodiment of a PTU system having a PTU 102 with an associated primary resonator coil 206, an auxiliary coil 207 and auxiliary coil driver circuit 209, a plurality of CMCM devices 400, 500, 502 and an array of detection coils 414 formed in rows 418 and columns 416. Here the PTU 102, which may be similar to the PTU in FIG. 3, has a power supply 312, a power amplifier 310, a matching circuit 308 and a communication module 316 controlled by, for example, the controller 314. Here the main charging coil, primary resonator coil or main charging coil 206 is positioned in a coil enclosure 410 along with the array of detection coils 414. The coil enclosure 410 may be any structure or substance designed to contain and hold various resonator coils in place and in the same or proximate parallel planes. The primary resonator coil 206 may be centrally positioned in the coil enclosure 410. Under control from the controller 314, the power supply 312 produces an AC output that is provided to the power amplifier 310. The frequency of the AC output is controlled by the controller 314. The power amplifier amplifies or significantly increases the AC voltage into a high frequency alternating current. The alternating current is sent, via the impedance matching circuit 308 to the primary resonator coil 206. The impedance matching circuit 308 is used to match the output impedance of the PTU with the impedance of the primary resonator coil 206 at the AC frequency. The controller may adjust the impedance of the matching circuit 308 to help match the output impedance of the PTU when it is coupled to one or more PRUs. The alternating current flowing within the primary resonator coil 206 creates a magnetic field which may couple to the receiver coil 220 (not shown in this figure) when within a specified distance. The magnetic field generates an alternating current with in the receiver coil 220. The alternating current is converted by the PRU into direct current (DC) for charging or operating a load.

The coil enclosure 410 may also include the array of detection coils 402. In the embodiment shown, the array of detection coils is an eight×eight (8×8) array of resonating coils 414. The array may be N columns 416×R rows 418 of resonating coils. Other embodiments may organize the array of detection coils as any of a wide variety of array formations. Each of the coils 414 in the array of coils 402 may be configured to transmit a magnetic field and to receive a magnetic field, but not do both, transmit and receive, at the same time.

It is not unusual for the PTU 102 to drift in its power or frequency out, thereby causing a drift in the sensing signal output by each sensing coil 414. In accordance with an example embodiment of this disclosure, a reference sensor coil 413 is located in or immediately or adjacent to the primary charging coil 206, having an output 415 connected to the controller 314. The reference sensor coil 413 is configured to output a reference sensing signal characterizing a time-varying magnetic intensity of the magnetic field generated by the main resonator or primary charging coil 206 due to any drift in the power or frequency output of the PTU 102. The controller 314 is configured to compensate for the time-varying magnetic intensity, in the determination of which sensors 414 in the array 402 are outputting sensing signal indicating the residence of the foreign object proximate to the sensors.

The controller 314 is also connected, via a bus 412 or other electrical connections, to one or more configurable TX/RX multiplexed coil monitoring (CMCM) devices 400, 500, 502. The one or more CMCM devices 400, 500, 502 are connected to the array of detection coils 402. As shown in FIG. 4, the CMCM devices 400, 500, 502 are each connected to a plurality of coils 414 in different columns of coils in the array of coils 402. Here, a first one of the CMCM devices 400 is connected to the eight (8) resonating coils 414 in a first column 416 of the array of coils 402. Similarly, a second CMCM device 500 is connected to the eight (8) resonating coils 414 in a second column of the array 402. In this embodiment there is a separate CMCM device 400 connected to each of the 8 detection coils of each row 416 of the array of detection coils 402. Other arrays of coil configurations may also be used.

The controller 314 can initialize and configure each of the CMCM devices 400, 500, 502 to heuristically drive (i.e., transmit to) or receive magnetic signals from selected ones of the detection coils 414 in each row 416 of the array of coils 402 in order to perform a variety of monitoring functions in the area about the primary resonator coil 206. Each of the CMCM devices can be configured to provide a variety of transmit and receive functions that enable foreign object detection functions, and a variety of heuristic monitoring functions.

For example, a foreign object detection system may be provided to determine whether an unexpected metal or otherwise conductive object is on or near the primary resonating coil 206. With an 8×8 array of detection coils 402, the individual coils 414 in the array of coils may be positioned symmetrically. Each resonating coil 414 in each of the columns 416 of the array of coils is connected to differential input/outputs (I/Os) of the respective CMCM devices 400, 500, 502, etc. Thus, if there are eight (8) resonating coils 414 in a column 416, then there will be eight (8) differential I/O connections 420 to the respective CMCM devices 400, 500, 502. Each I/O connection is connected to inputs of an analog multiplexer within the respective CMCM device 400, 500, 502 for monitoring and analog processing by a receiver circuit in a multiplexed manner. Simultaneously, in the same and/or other columns 416 of resonating coils, one or more of the coils 416 may be driven by an alternating current provided from a respective CMCM device's I/O connections 420 such that the one or more resonating coils 414 transmit magnetic fields that may be magnetically coupled to coil 414 that is being monitored by the CMCM device. It is important to note that when a selected coil 414 is being monitored via the analog multiplexer within, for example, CMCM device 400, the respective I/O associated with the selected coil 414 is configured to only receive a coupled magnetic field signal from the coil and not be driven simultaneously, or damage could result to the CMCM device.

In some systems that incorporate embodiments of the invention, the main resonator coil 206 may be driven by the PTU 102 with a main resonator signal 417 of about 85 kHz for automotive WPT systems or a signal of about 80 kHz to about 400 KHz, or about 6.78 MHz, for consumer equipment (CE) related WPT systems. In automotive WPT systems, the main resonator coil 206 may transmit 85 kHz at about 14 kWh to a receiving resonator coil of a PRU. In some embodiments, periodically while transmitting, the PTU 102 may turn off the main resonating coil 206 in order to check whether a metallic or conductive foreign object has become present in or proximate to the magnetic field of the main resonator coil 206. In other embodiments, the PTU 102 does not turn off the main or primary resonator coil 206 to check for foreign objects. In one example, a coin, piece of aluminum foil, or other conductive or partially conductive object may have been dropped or otherwise found its way onto the coil enclosure 410. Such a foreign object may heat up significantly and cause a potentially hazardous situation or may adversely affect the efficiency of the wireless transmission of power from the PTU 102 to the PRU 204. While the main resonator coil is on during power transfer, or while the main resonator coil 206 is off, such as when no PRU is present, or when the PRU is not requesting power, an auxiliary coil 207 may be energized by an auxiliary coil driver 209 at the instruction of the PTU controller 314. In some embodiments, the auxiliary coil 207 is driven at about 21 kHz with fairly low power of between about 3 and about 20 W. The auxiliary coil 207 is used to help determine if a foreign object has become present on or in proximity to the coil enclosure 410. While the auxiliary coil 207 is energized, the CMCM devices 400, 500, 502, input in a multiplexed manner the received present voltage of each coil 414 in the array of coils 402. Here the CMCM devices may not be used to transmit or output any signals to the coils 414 in the array of coils 402. The received present samples of the voltage of each coil 414 in the array of coils 402 may be compared with previously measured and saved samples of such respective measurements of the same coils 414 indicative of a calibration without foreign objects present. Such previous measured samples may have been taken during initial testing of the WPT system when it was known that no foreign objects were near the array of coils 402, the main resonator coil 206, or the auxiliary resonator coil 207. The present measurements, or in some embodiments ratios of received voltages between selected coils in the array of coils, and previously measured measurements or similar ratios can be compared by one or more DSP circuits in the CMCM devices 400, 500, 502 and/or the controller 314 using 2-dimensional digital signal processing techniques to determine if there is a significant enough difference in present and previously received voltages or ratios of certain proximate coils in the array to be indicative of a conductive foreign object being present. In some embodiments the ratios of received voltages between selected detection coils are scaled to coincide with the power level setting of the energy being transmitted. The DSP circuits in conjunction with the controller 314 may also be able to provide a general location of where (row and column) on the array of coils 402, above the array of coils 402 or near the array of coils 402 the foreign may be present.

In general, precise measurement of the magnitude of the output voltage produced by the sensor coils 414 require sampling by the controller 314 at multiple instance within the period of oscillation by the driving source, and repetitive sampling over many such periods. It is possible that whatever coil is generating the driving signal can be controlled to adjust its power output during this timeframe. In this case, if the voltages from the various sensor coils 414 are sampled one after another (at different instants in time), these time variations of the main power level might be misinterpreted as spatial variations in the magnetic field generated across the sensor coil array 402. In other words, the time variations could introduce errors in the measured "profile" of the generated magnetic field, because of the sequential nature of the coil scanning process. Since changes in the generated magnetic field profile and the resulting differences in adjacent sensor readings are the basis of the foreign object detection process, any such errors could cause faulty readings, such as false detection of a foreign object, or failure to detect an actual foreign object.

To compensate for the influence of possible time-based variations in system power, the extra reference sensor coil 413 is added to the coil set. The reference coil data are sampled simultaneously with each "signal" data in the controller 314, which can be facilitated by utilizing two parallel ADC inputs internal to the controller 314 (not shown). In this way, each signal coil's 414 voltage can be calculated as a ratio to the reference coil 413 voltage, thereby assisting in the compensation for possible changes of power during the data collection process. Even if the main power changes with time, the ratio of "signal" to "reference" voltages would be the same, which improves the integrity of the data.

An alternate method for performing this function is to use any one of the sensor coils 414 as a reference coil, such that at any sampling instant two coil signals would be sampled: the one of coils 414 operating as the reference signal and one of the other coils 414 acting as the sensing coil. The resulting ratio of signals would again provide a measure of immunity against mistaking any time variations for spatial variations in the profile measurement.

In some embodiments, the auxiliary coil 207 may not be necessary at all or may not be necessary during power transfer, or in low power mode. Instead, the main resonating coil 206 may be able to remain on and continuously transmit power to the PRU 204 while periodically a received voltage on each of the coils 414 in the array of coils 402, induced from the main resonating coil 206, is input to and measured in a multiplexed manner by the CMCM devices 400, 500, 502. The measured voltages, or ratios thereof based on the transmitted power level, of each of the coils 414 in the array of coils 402 may be compared with a saved sample of a previously measured voltages that, for example, were taken during initial testing of the WPT system or at a time when it was known that there were no conductive foreign objects near the array of coils 402 or the main resonating coil 206. The presently and previously measured voltages of each coil 414 in the array of coils 402 may be compared. If the difference between one or more of the previous and present respective coil voltages is greater than a predetermined amount, then there is an indication that a conductive foreign object may have become present on the coil enclosure 410. If there is an indication that a conductive foreign object is present, then the PTU may go into the latching fault state and turn off transmission to the main resonating coil 206.

The CMCM devices 400, 500, 502 may in effect be connected and configured to both transmit magnetic field signals at one or more of the resonating coils 414, while simultaneously receiving analog signals from other selected resonating coils 414 in a multiplexed manner when such coils are not transmitting. As will be further described below, in some embodiments, the phase and amplitude of the voltage signal received at each multiplexed resonating coil can be determined by the CMCM device and provided to a controller for use in foreign object detection or for use in determining a proximate location of the foreign object on a surface of the coil enclosure based on the resolution established by the resonating coils 414 in the array of detection coils 402. Each of the respective CMCM devices 400, 500, 502 may be configured to provide a determined and relative phase and amplitude information to the controller 314 where additional foreign object detection and analysis of the signals may be performed.

Additionally, it should be noted that all of the coils 414 in the array 402 are illustrated as being identical. However, the size of each of the coils 414 could be independently sized in accordance with their physical location within the array, such that different sensitivities are realized as a function of the location within the array. This recognizes the variation in the magnetic field generated by any driving coil across the array.

Figure 5:
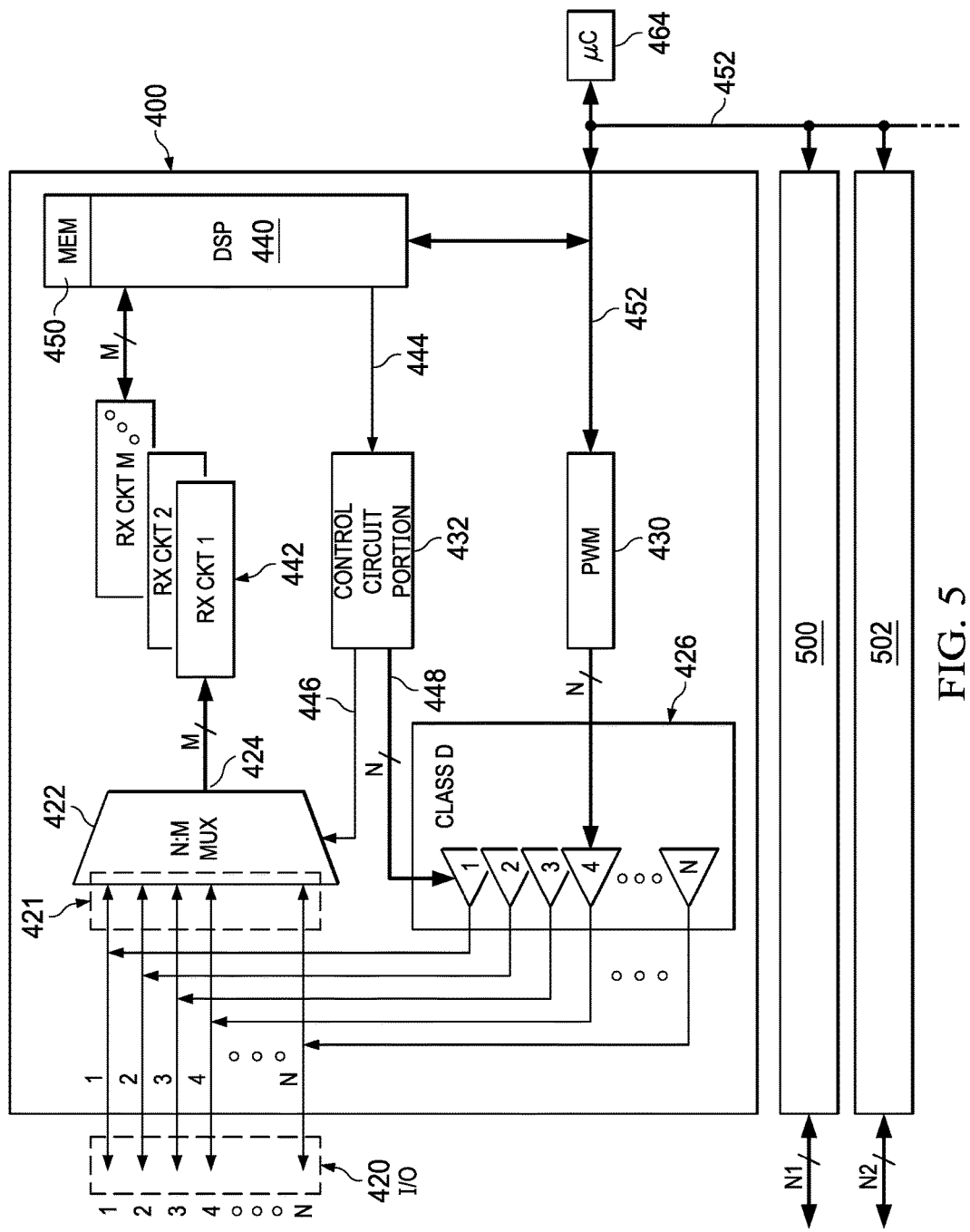
FIG. 5 illustrates a block diagram of an embodiment of a Configurable TX/RX Multiplexed Coil Monitoring (CMCM) device.

FIG. 5 provides a block diagram of an embodiment of an CMCM device 400, which may be a single chip semiconductor device having a plurality of dual function input/output (I/O) connections 420. Shown are I/O connections 1 through N, where N is a positive integer greater than two. Each of the N I/O connections 420 is configured to be electrically connected to an external circuit device such as a coil or inductor device. In various embodiments, the connection to external coils may be accomplished without additional circuitry elements such as matching impedance circuits or filtering capacitors. Each of the N I/O connections 420 is also connected to respective N mux inputs 421 of an analog multiplexer 422. The analog multiplexer 422 may have at least N mux inputs and at least one output 424. In some embodiments, the analog multiplexer 422 may have M outputs, where M is a positive integer that is less than N (M<N). The analog multiplexer 422 may also receive mux input select and mux enable on one or more lines 446. The mux input select signal indicates which ones of the N mux inputs are to be forwarded to the M mux outputs 424. The mux enable signal is used to enable or disable the analog multiplexer 422. When the analog multiplexer is disabled, all the I/O connections 420 can be used as outputs.

Each of the N I/O connections 420 is also connected respectively to the driver outputs of N gate driver circuits 426. Each one of the N gate drivers 426 has a differential output configured to drive both sides of a resonating coil 414 with an alternating current or signal. The gate drivers 426 may also receive a same pulse width modulated (PWM) signal or, in some embodiments, each of the N gate drivers may receive one of N separate PWM signals from a PWM circuit 430. In some embodiments, the PWM circuit 430 can be set to drive one or more of the N gate drivers simultaneously with a same or various different PWM signals. The PWM circuit 430 may have one or more PWM generator circuits that each produce PWM signals in accordance with a PWM control signal. Additionally, in various embodiments, each of the gate drivers 426 may have single ended output drivers.

When the gate drivers 426 are connected, via the I/O connections 420 to external inductors or coils, the impedance associated with the connection to the coils results in smoothing or rounding any squared edges of the gate driver output into an AC signal.

Additionally, the mux input select and mux enable signals, as well as the gate driver enable signals for each of the N gate drivers 426 may be provided by a control circuit portion or from external signal connections. Regardless of their origin, the timing of the mux select, mux enable, and the N gate driver enable signals must be orchestrated so that each of the N TX/RX I/O connections 420 are not set to both transmit and receive signals at the same time. In general, when the analog multiplexer 422 is not enabled by the mux enable signal, any of the N gate drivers 426 can be enabled to transmit a designated AC signal to be output on respective N I/O connections 420. When the analog multiplexer 422 is enabled by the mux enable signal and an input is variably selected by the mux input select signal, then corresponding gate driver circuit(s) connected to the enabled multiplexer input(s) are disabled and tri-stated (isolated) by the respective gate driver enable signal. In other words, when the analog multiplexer is enabled by the mux enable signal and the mux select signal designates the M selected ones of the N mux inputs, then any of the N gate drivers 426 can be enabled by the N respective gate driver enable signals except for M gate drivers that correspond to the M selected one of the N mux inputs.

In some embodiments, a control circuit portion 432 may provide the mux enable, mux select, and gate driver enable signals based on other signals received. In other embodiments, some or all of the enable and select signals may be provided from a digital signal processor circuit (DSP) 440 or from an externally connected controller, such as controller 314 of FIG. 4. Embodiments provide a single chip solution that can selectively and individually drive a plurality of coils in an array of coils while simultaneously monitoring signal voltages and phases received from selected coils in an array of coils that are not being driven. This is useful in the implementation of foreign object detection, and other systems that utilize an array of coils.

Still referring to FIG. 5, the selected analog multiplexer input is output at the multiplexer output 424. If more than one input can be multiplexed to more than one output of the multiplexer 424, there may be up to M outputs from an N input analog multiplexer, where N>M and N and M are positive integers. The selected analog multiplexer output is provided to a respective receiver circuit 442. For M analog multiplexer outputs, there are M receiver circuits 422 operating in parallel. Each of the M receiver circuits 442 is configured to receive one of the selected differential AC analog signals, adjust its gain, demodulate and convert it to one of M digital signals for use by the DSP circuit 440. The DSP circuit 440 is configured to analyze the received digital signal. In some embodiments the DSP circuit 440 determines the amplitude and phase shift of a selected received input relative to a predetermined standard, previously received input, relative to an input from another coil proximate to the selected input's associated coil, relative to a common clock used to create PWM output, or relative to the one or more AC signals transmitted by one or more of the N gate driver circuits 426 via respective I/O connections 420 to one or more coils in the array of coils. The DSP circuit in this embodiment provides a control signal 444 to the select and control portion circuit 432, which coordinates the mux enable and mux select signals 446 with the N driver enable signal 448 so that respective ones of the N gate drivers are not enabled at the same time for the respective mux inputs that are selected.

The DSP circuit 440 is connected to a bus or data lines 452 that are configured for connection to an external controller 454. Additionally, the PWM 430 may be connected to and controlled via data lines 452. The DSP circuit 440 and PWM 430 circuit may both be initialized and/or controlled by the external controller 464. The DSP 440 may also include or be associated with an on-chip DSP memory or register 450, which may store initialization and configuration data utilized by the DSP circuit 440 at start-up and during operation. In some embodiments, the register 450 is also utilized to initialize and configure the PWM circuit 430 via the data lines 452. In other embodiments, the external controller 464 controls the PWM and operation of the DSP. In yet other embodiments, the external controller 464 loads or updates the memory or registers 450 to control and alter the functionality of the CMCM device 400 during operation. In yet other embodiments, the memory or registers 450 are initialized to enable the DSP circuit 440 to operate and control the CMCM in a state machine manner.

The controller 464 may be connected to a plurality of CMCM devices 400, 500, 502 via the data lines 452 so that selected coil arrays of various configurations can be transmitted to and received from in a configurable manner orchestrated to provide a foreign object detection, object position, and other functions using one or more arrays of coils associated with a PTU or a PRU.

Figure 6:
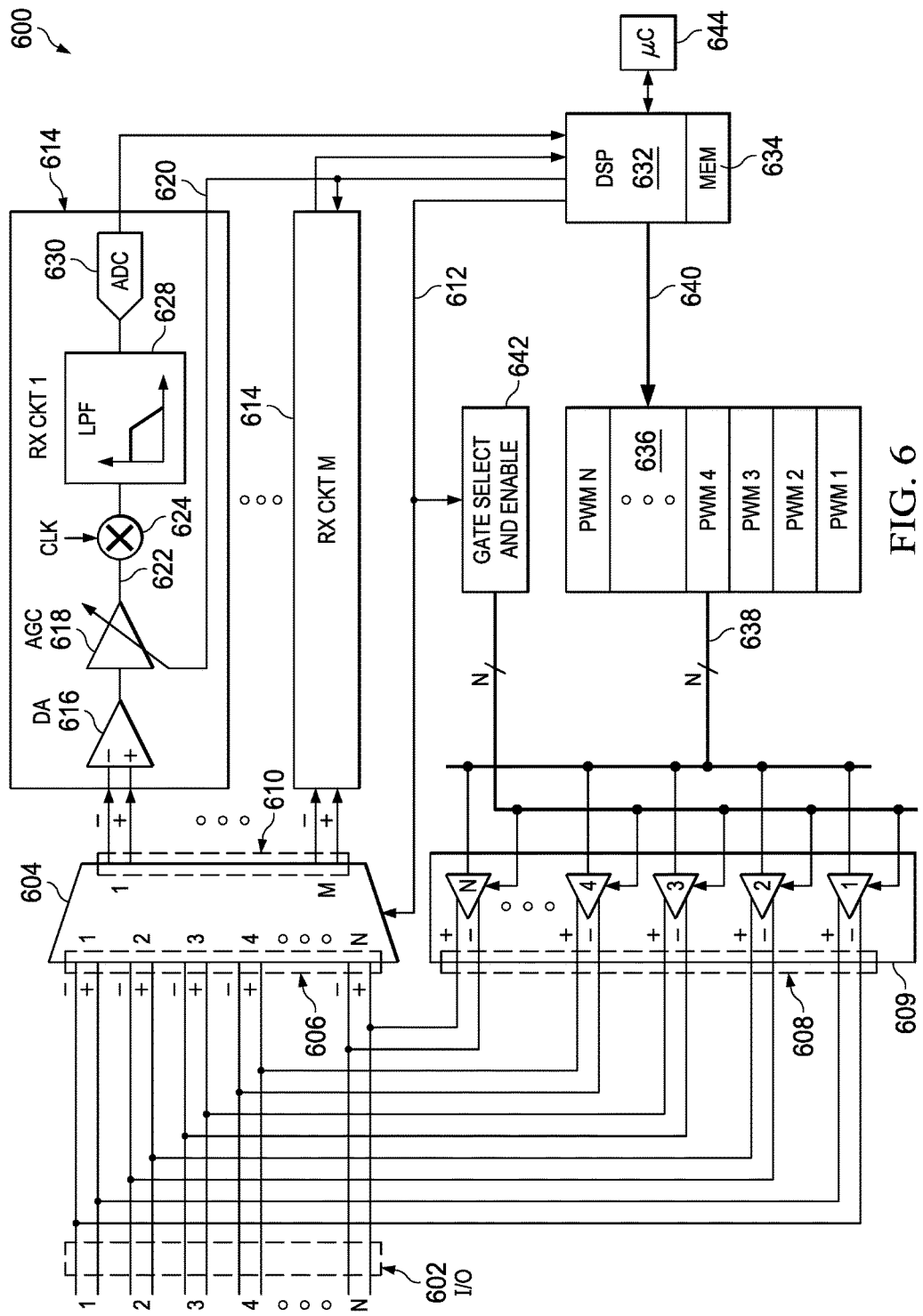
FIG. 6 illustrates a more detailed block diagram of an embodiment of a Configurable TX/RX Multiplexed Coil Monitoring (CMCM) device.

Referring now to FIG. 6, a more detailed schematic of a CMCM device 600 is shown. There are N I/O connections 602. Each I/O connection has two connections for differential AC inputs and outputs that may connect to both ends of an induction coil within, for example, an array of detection coils. Each I/O connection of the N I/O connections 602 is connected to respective N inputs 606 of an analog multiplexer 604 and to respective N outputs of a plurality of gate drivers 610. The analog multiplexer inputs 606 and gate driver outputs 608 are differential inputs and outputs respectively.

In embodiments wherein the analog multiplexer 604 is a multiple input/single output multiplexer, the multiplexer 604, when enabled by an enable signal for control signal 612, forwards a selected input signal on a selected one of the N inputs to a differential mux output 610 in accordance with a mux select signal from control signal 612 provided to the analog multiplexer 604. In various embodiments, the mux enable signal and mux select control signals 612 may be provided to the analog multiplexer 604 on the same or on separate connections. It is noted that when the analog multiplexer 604 is not enabled by the enable signal, all of the analog inputs 606 are held at a high impedance regardless of the input designated by the mux select signal.

The selected input signal is provided from the differential mux output 610 to a receiver circuit 614. The receiver circuit 614 receives the selected input into a differential amplifier 616, which measures the difference between the differential signal input connections and provides a difference signal as a single output. The output of the differential amplifier 616 is then provided to an adjustable automatic gain control amplifier (AGC) 618, which provides control of the signal amplitude at its output, despite variation of the amplitude in the input signal. The AGC 618 may dynamically adjust the input-to-output gain to a suitable value, enabling the AGC 618 to operate with a greater range of input signal levels. Embodiments with an adjustable AGC 618 receive an AGC adjust signal 620 to further allow for a greater range of input signal levels to be accepted by the CMCM device 600. The AGC outputs a gain adjusted input signal 622.

The gain adjusted input signal 622 from the AGC 618 is then mixed in a mixer 624 with a clock signal from a local or external oscillator or clock (not specifically shown) so that the received selected input has a common intermediate frequency. The mixed signal is then provided to a low pass filter 628 to remove unwanted high frequency components from the input signal. The received selected input signal is then converted from an analog signal to a digital input signal by an analog-to-digital converter 630. The digital input signal is then provided to a digital signal processing circuit (DSP) 632.

The DSP 632 is configured to receive the stream of digital input signals 633 from the receiver circuit 614 and determine amplitude and phase shift characteristics of the selected input signals received and multiplexed from, for example, an array of detection coils connected to the I/O connections 602 of the CMCM device 600. In some embodiments, the DSP 632 determines whether the amplitude and phase from each of the multiple 1-M receiver circuits 614 can be determined. The DSP 632 may also determine the amplitude and phase from previously received measurements stored in memory 634. The DSP 632 may be initialized and configured via connections to an external controller 644. Configuration of the DSP 632 and the entire CMCM device 600 may be done upon initialization or at any time during operation by loading configuration information into the memory or register 634. The DSP may also provide the AGC adjust signal 620 to the receiver circuit 614, the control signal 612 or signals that are used to provide the mux enable and mux select signals 612, and gate drive enable signals that are received by the gate select and enable circuit 642.

In alternate embodiments, wherein the analog multiplexer 604 can multiplex more than one of the N input signals to more than one mux output, or more generally stated, where M of the N multiplexer inputs 606 can be directed to M separate multiplexer outputs (M<N and both are positive integers), there can be M receiver circuits 614 configured to receive each of the selected M input signals selected by the mux select signal 612. Each of the M receiver circuits 614 receive one of the M selected input signals and provides a corresponding digital input signal to the DSP 632.

A pulse width modulation (PWM) circuit 636 provides a PWM signal 638 to each of the N gate drivers 609. The PWM circuit 636 may be configured to provide a same or up to N different PWM signals 638 to respective N gate drivers 609. The DSP 632 may provide a PWM control signal 640 to the PWM circuit 636. The PWM control signal 640 defines the N PWM signals 638 to be provided to the respective N gate drivers 609. In some embodiments, the PWM control signals 640 are provided directly from the controller 644 to both the DSP 632 and the PWM 636. Additionally, a control signal 612 (which may be the same as the mux enable and mux select signals) may be provided to a driver control portion circuit 642. The driver control portion circuit uses the control signal 612 to enable or disable selected ones of the N gate drivers 609 such that when the multiplexer is enabled and any multiplexer input(s) is selected, the corresponding gate driver(s) that have their output connected to the selected multiplexer input(s) are not enabled. A gate driver should not transmit directly into a respective selected mux input because it will most likely damage the multiplexer circuit.

In other words, the driver control circuit may enable and configure any of the N gate drivers 609 to provide an output to their respective I/O connections 602, except for the gate driver(s) having outputs connected to selected multiplexer input(s). As the multiplexer inputs are selected and deselected for receiving input signals, the driver control portion circuit may use logic or controller like circuitry to disable and enable respective ones of the N gate drivers such that any I/O connection that is selected for mux input and monitoring by the receive circuit and DSP will not simultaneously be driven by a respective gate driver. Thus, embodiments provide a CMCM device that shares I/O connections to and from a plurality of external detection coils and provides coordinated drive and receive functions for the plurality of external detection coils such that selected monitored coils (i.e. selected mux inputs) are never simultaneously driven by a gate driver. The coordinated external coil drive and receive functions may be provided on a single chip solution that is configured not to drive any I/O connection at the same time that I/O connection is selected to receive input signals from a coil for monitoring.

Figure 7:
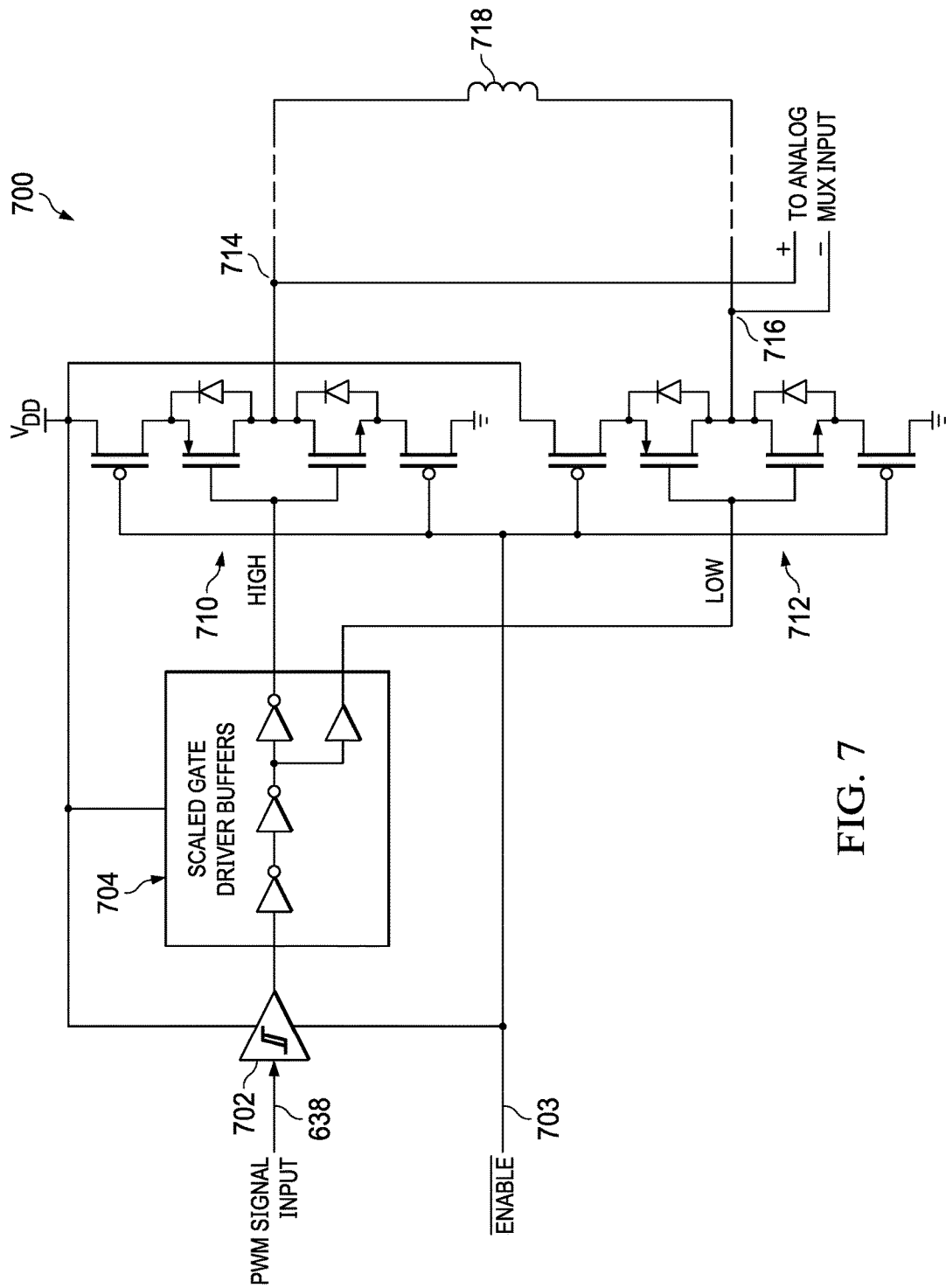
FIG. 7 illustrates a general schematic diagram of a Class-D gate driver embodiment.

FIG. 7 is a general schematic of a gate driver circuit 700 that may be used in various embodiments. In general, each gate driver circuit is operable to drive an AC current through an inductive coil 718 in order to produce and transmit an alternating magnetic field that can be coupled to and received by another coil that is proximate or near the transmitting coil. In order to handle the power requirements necessary to transmit magnetic energy from a coil to a nearby coil a plurality of differential Class-D gate drivers, such as the Class-D gate driver 700, may be used. Such Class-D gate drivers may operate with a Vdd of about 5 Volts and output an AC current at frequencies between about 4 kHz and 450 kHz. Here a PWM signal 638 is provided to the input of a comparator 702. A gate drive enable signal 703 may also be provided to enable the gate driver circuit 700. Additionally, when the gate driver circuit is not enabled, the enable signal is used to hold the differential I/O output 714, 716, which may incorporate tristate buffer circuitry, in a floating state so it will not pull the respective I/O input and analog mux input low or high. The output of the comparator 702 is provided to scaled gate driver buffers 704, which increase in scale and current capability in order to be able to drive the high and low sides of the differential gate driven output drivers 710, 712. The high side output 714 and low side output 716 of the Class-D gate driver 700 are operable to be connected to and drive both sides of a coil 718 (without impedance matching or other external components) in order to transmit an alternating magnetic field from the coil 718. When the class D gate driver 700 is not enabled and the differential output 714, 716 are floating, an alternating magnetic field transmitted by a proximate or nearby coil may be coupled to and received by the coil 718 and provided via I/O connections 714, 716 to a selected input of the analog multiplexer and receiver circuitry on the CMCM 600 device. Although not specifically illustrated, some embodiments may include delay circuits prior to the inputs of drivers 710 and 712 in order to account for pulse overlap.

Embodiments of the CMCM device enable heuristic monitoring of changes in magnetic energy reception of any coil in an array of coils in a wireless charging system. Such heuristic monitoring enables one or more coils in an array of coils to transmit magnetic energy while another proximate coil monitors for a change in reception of the magnetic energy with respect to a previous monitoring of the coil. Thus, advanced foreign object detection monitoring prior to and during wireless magnetic energy exchanges of a PTU and PRU can be readily performed. Additionally, locations of existing and newly placed PRU devices about a PTU's transmission coil(s) may be easily determined by sensing for changes in the voltage and phase from received magnetic signals at each of the detection coils in the array of coils positioned about a main transmission coil of the PTU system. When a significant enough or predetermined amount of change is sensed at a coil in the array, a location of a foreign object or newly placed PRU may be determined.

Embodiments do not require impedance matching circuits between the I/O connections and the plurality of coils connected to them. Instead, the each detection coil in the array of coils can be directly connected to the I/O connections of embodiments of the CMCM device(s). The CMCM devices can, for example, each transmit and receive to a one of a plurality of columns of detection coils that make combine to establish an array of coils.

Embodiments may include in a variety of WPT systems that perform foreign object detection, foreign object position detection and other coil array monitoring techniques used on a PTU or PRU device. In accordance with various embodiments, foreign objects, such as metallic objects, may be of sufficient size or extent to perturb the efficiency or power transfer capabilities of a WPT system. In such cases, the presence of such a foreign object may be determined by examining a change over time in one or more of the voltage, current, and/or power transferred from one selected transmission coil to two or more receiving coils adjacent to or in the general area of the selected transmission coil. In some situations a metallic foreign object may change the impedance of a coil coupled to another coil by a resonant magnetic field and thereby perturb the characteristics of energy transfer there between. An impedance change may be detected by measuring the voltage, current, power, phase, frequency and the like of the receiving coils and the wireless energy transfer. Changes or deviations from expected or predicted values may be used to detect the presence of a rogue metallic object on or about the array of coils.

It has been found that by using selected coils in the array of smaller coils 402 to selectively transmit and receive magnetic fields to each other, instead of for example a single larger auxiliary coil 207 to transmit a magnetic field to be received and monitored by each coil in the entire array of small coils, smaller metallic objects such as a metal-foil-and-paper chewing gum wrapper can be more easily detected. For example, a metal-foil-and-paper chewing gum wrapper may not substantially alter or perturb the magnetic flux between the large auxiliary coil 207 and any of the smaller coils 414 in the array of coils 402, but is will more likely substantially alter the magnetic flux between two small coils 414 proximate to each other in the array of coils 402. In embodiments the presence of the metallic object may be detected by measuring a change in the detected or expected voltage, current, power, phase, frequency and the like of the receiving coil. Additionally, the parameters of the transmitting coil, transmit current and induced voltage on the receive coil can be utilized to calculate the impedance or Z-parameters, such that any variation therein can be correlated to the presence of a foreign object.

Figure 8:
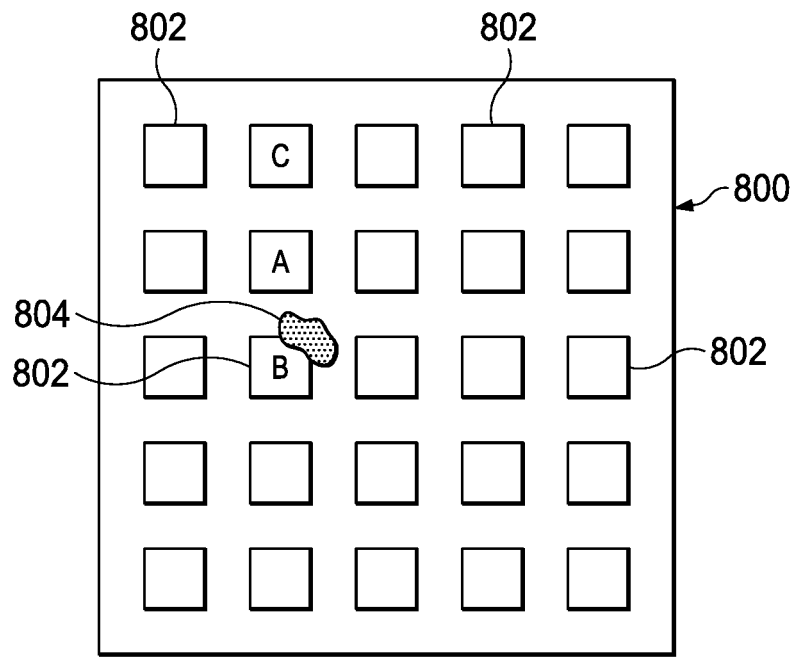
FIG. 8 illustrates an array of coils utilized in foreign object detection in accordance with an embodiment.

Referring now to FIGS. 4, 6 and 8, wherein FIG. 8 depicts an array of coils 800 that are each similarly sized and formed. In accordance with various embodiments, the array of coils 402 or 800 may be utilized to perform foreign object detection functions between any two or more adjacent coils 414 or 802 in the array of coils 402 or 800. Each of the coils 802 in the array of coils 800 are connected to a CMCM devices (not specifically show in FIG. 8) in a manner similar to the coils 414 in FIG. 4. Keeping this discussion simplified, a foreign object detection device may be realized using as few as two adjacent coils 802, such as coil A and coil B. During operation the CMCM device 600 outputs, via an enabled gate driver 609-2, a defined AC signal having an original phase to coil A. Simultaneously, a mux input 606-3 of the analog multiplexer 604 may be selected to receive a signal from coil B and provide the received signal to the receiver circuit 614 and the DSP circuit 632 wherein the received voltage, current, power, and phase may be determined. If the enabled gate driver 609-2 continued to transmit the defined AC signal and the mux select signal is changed to select mux input 606-1, which is connected to coil C, one would expect that since coils B and C are similar in size and are in regions of a relatively uniform magnetic field established by coil A, then the difference between voltages and phase changes received by the loops would be very small. If for example, a foil chewing gum wrapper 804 is placed such that it partially covers coil B, but not any of the other proximate coils around coil B, then a comparison of a second result from coil B of the determined voltage, current, power, and phase will be different from the previously determined results from both coils B and C. When a previously determined result from coil B or a determined results from another coil (coil C) similarly proximate to the transmitting coil (coil A) are different from the second result from coil B, then it may be determined that a foreign object is on the array of coils and may interfere with transmission of the a main coil's efficiency of transferring energy to a PRU.

In various embodiments, the voltage and/or phase on each coil in the array may be measured in sequence or may be multiplexed in a way that allows for any selectable variety of heuristic monitoring for metallic foreign objects on or around the main transmission coil 206. Additionally, the voltage on any given coil may be sampled at increments that allow the DSP circuit on respective CMCM devices to determine the amplitude and phase of the induced waveform relative to a reference waveform. In some embodiments, the time-sampled electrical signal from a selected coil 802, 414, may be processed to determine the amplitude and phase of the received signal with respect to a reference signal. The reference signal may be derived from the same clock or a clock synchronized with clocks on other CMCM devices in the system that is used to provide the PWM signal generated on the CMCM devices.

Figure 9A:
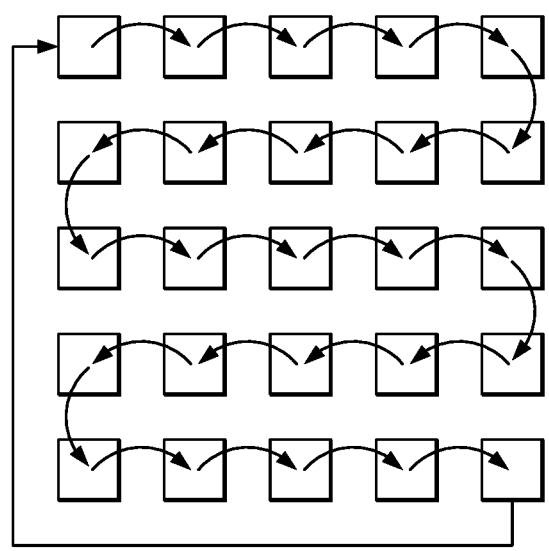
FIG. 9A illustrates an embodiment having an array of coils monitored in a serial manner.
Figure 9B:
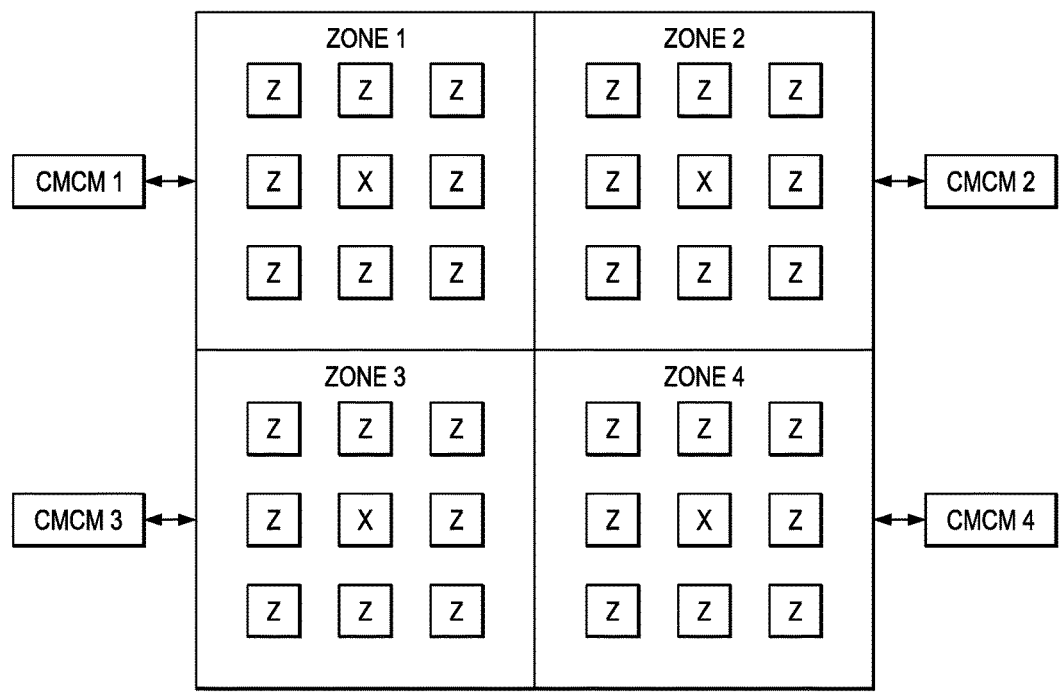
FIG. 9B illustrates an embodiment having an array of coils used to monitor defined zones of the array of coils.
Figure 9C:
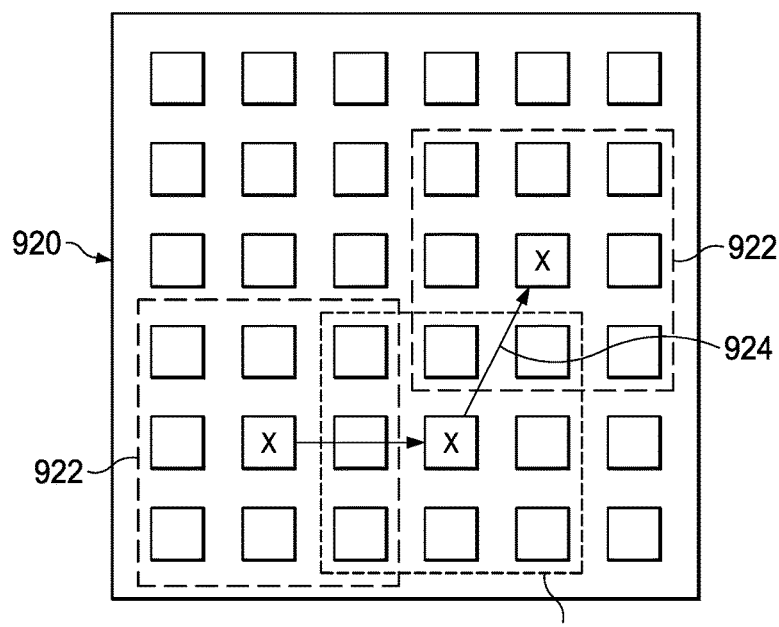
FIG. 9C illustrates an embodiment having an array of coils wherein a subset array of coils is shifted about the array of coils and monitored.

Embodiments of the CMCM device enable a transmission to one or almost all of the coils in an array of coils, while simultaneously monitoring the received voltage and phase received at selected coils of the same array that are not being transmitted to. The variety of configurations for transmitting to and receiving from the array of coils are enormous. A few transmit and receive configurations are depicted in FIGS. 9A, 9B and 9C. FIG. 9A depicts a 5×5 array of coils wherein the associated CMCM devices (not specifically shown) are configured to transmit a predetermined signal to all the coils except for the one coil that is selected to be input into the multiplexer. As each coil of each row in each of the rows of the array of coils is serially selected to be input to the analog multiplexer so the voltage and phase of the induced waveform in the selected coil can be determined by the DSP circuit, all of the remaining unselected coils are transmitting a determined AC signal from enabled Class-D gate drivers on the connected CMCM device(s).

FIG. 9B depicts a configurable monitoring of the array of coils wherein there are four zones defined on the array of coils as zones 1, 2, 3, and 4. The coils of each zone are connected to a respective CMCM device (CMCM1, CMCM2, CMCM3, CMCM4). The CMCM devices may be sequentially configured so that the CMCM1 drives its associated Z coils that are peripheral and proximate to a central coil X that receives an induced waveform in zone 1, then CMCM2 drives its associated Z coil while monitoring the central receiving X coil and the sequence is similarly repeated for zones 3 and 4.

FIG. 9C depicts an array of coils 920 wherein a changing 3×3 subset 922 of the array of coils 920 is sequentially shifted across or about the array of coils in a predefined pattern 924 wherein at each shift a changing center X coil of the changing 3×3 subset of the array of coils is selected to be a receiving coil of an induced waveform that is coupled from the changing Z coils surrounding the changing center X coil. The changing Z coils are transmitting coils connected to enabled gate drivers.

Thus, embodiments enable an array of coils to be configurable for changing transmit and receive coil arrangements that may be configured to receive on one of the coils of the array of coils while transmitting on none of to all of the remaining coils in the array of coils, to receiving in a multiplexed manner on one or all of the coils of the array while transmitting on none to all of the coils in the array of coils not selected as the receive coil.

It will be appreciated by those skilled in the art having the benefit of this disclosure that embodiments of this configurable wireless charging TX/RX device provides a single chip solution for selectively driving AC power to N I/O connection, wherein each I/O connections is configured to drive a different one of the N coils to transmit magnetic energy, while simultaneously selectively receiving magnetically coupled energy via one of the N I/O connections in a multiplexed manner such a voltage and phase of the coupled energy can be determined, and controlling the driving of and receiving on the N I/O connections such that each I/O connection cannot be both driven and received at the same time. It should be understood that the drawings and detailed description herein are to be regarded in an illustrative rather than a restrictive manner, and are not intended to be limiting to the particular forms and examples disclosed. On the contrary, included are any further modifications, changes, rearrangements, substitutions, alternatives, design choices, and embodiments apparent to those of ordinary skill in the art, without departing from the spirit and scope hereof, as defined by the following claims. Thus, it is intended that the following claims be interpreted to embrace all such further modifications, changes, rearrangements, substitutions, alternatives, design choices, and embodiments.

What is claimed is:

1. An integrated circuit comprising:
N shared input/output (I/O) connections, each of the N shared I/O connections being configured to connect to N respective coils, wherein N is a positive integer greater than 1;
an analog multiplexer having N mux inputs each connected to a respective one of the N shared I/O connections, the analog multiplexer configured to direct an AC input signal from a selected one of the N mux inputs to a mux output when the analog multiplexer is enabled;
a receiver circuit configured to receive the AC input signal and convert the AC input signal to a digital signal;
a digital signal processor (DSP) configured to process the digital signal in accordance with a predetermined configuration and output processed data;
a pulse width modulation (PWM) generator configured to output PWM signals in accordance with a PWM control signal;
N gate drivers connected such that each respective gate driver receives a PWM signal from the PWM generator and a respective gate driver enable signal, each gate driver being configured to transmit an AC signal relative to the PWM signal only when enabled by the respective gate driver enable signal, the AC signal being provided to the respective one of the N shared I/O connections;
a control portion configured to provide mux enable and mux select signals to the analog multiplexer and to provide respective gate driver enable signals to respective N gate drivers in accordance with the predetermined configuration, such that when the analog multiplexer is not enabled by the mux enable signal, any of the N gate drivers can be enabled by the respective gate driver enable signal, and such that when the analog multiplexer is enabled by the mux enable signal and the mux select signal designates the selected one of the N mux inputs then any of the N gate drivers can be enabled by the respective gate driver enable signal except for one of the N gate drivers that is respective to the selected one of the N mux inputs.

2. The integrated circuit of claim 1, wherein each of the N gate drivers are class D gate drivers.

3. The integrated circuit of claim 1, wherein the DSP provides a control signal in accordance with the predetermined configuration to the control portion.

4. The integrated circuit of claim 1, wherein a control signal in accordance with the predetermined configuration is provided to the control portion from an external source.

5. The integrated circuit of claim 1, wherein each of the N shared I/O connections is a differential I/O connection comprising a group of two pins of the integrated circuit.

6. The integrated circuit of claim 1, wherein each of the N mux inputs is a differential input.

7. The integrated circuit of claim 1 wherein each of the N gate drivers provide a differential output to transmit the AC signal relative to the PWM.

8. The integrated circuit of claim 1, wherein the PWM generator is configured in accordance with the PWM control signal to output a same or different PWM signal to each of the respective N gate drivers.

9. The integrated circuit of claim 1, wherein the integrated circuit is incorporated into a wireless power transfer system having an array of N coils corresponding to the N respective coils and wherein the predetermined configuration operates to perform a foreign object detection function.

10. The integrated circuit of claim 1, wherein the DSP is further configured to determine a second voltage and a second phase of each AC input signal from the selected one of the N mux inputs relative to a previously determined first voltage and a first phase of each AC input signal from the selected one of the N mux inputs.

11. The integrated circuit of claim 10, wherein each AC input signal from a selected one of the N mux inputs is a coupled signal from at least one of a non-respective N gate driver outputs.

12. A configurable transmit/receive (TX/RX) device for driving and receiving signals between at least two coils in an array of coils comprising:
   N inputs and N outputs (I/Os) that share a same respective N input and N output (N I/O) connections, wherein N is a positive integer greater than 1;
   an analog multiplexer having N mux inputs each connected to a respective one of the N I/O connections, the analog multiplexer further comprising M mux outputs, where M<N, the analog multiplexer configured to direct M AC input signals from each one of M selected ones of the N mux inputs to respective M mux outputs when the analog multiplexer is enabled;
   M receiver circuits each configured to receive a respective one of the selected AC input signals from respective M mux outputs and convert the respective selected AC input signal to one of M respective digital signals;
   a digital signal processor circuit (DSP) configured to process each of the M respective digital signals in accordance with a predetermined DSP configuration and output processed data adapted for use by an external device;
   a pulse width modulation (PWM) generator configured to output PWM signals in accordance with a PWM control signal;
   N gate drivers connected such that each respective one of the N gate drivers receives a PWM signal from the PWM generator, each respective one of the N gate drivers further receives one of N respective gate driver enable signals, each gate driver being configured to transmit an AC signal relative to its received PWM signal to the respective I/O connection only when enabled by its respective one of the N gate driver enable signals;
   a control portion configured to provide mux enable and mux select signals to the analog multiplexer and to provide the N respective gate driver enable signals to respective ones of the N gate drivers in accordance with the predetermined DSP configuration and such that when the analog multiplexer is not enabled by the mux enable signal any of the N gate drivers can be enabled by the N respective gate driver enable signals, and such that when the analog multiplexer is enabled by the analog mux enable signal and the mux select signal designates the M selected ones of the N mux inputs, then any of the N gate drivers can be enabled by the N respective gate driver enable signals except for M gate drivers that are respective to the M selected ones of the N mux inputs.

13. The configurable TX/RX device of claim 12, wherein each of the N gate drivers are class D gate drivers.

14. The configurable TX/RX device of claim 12, wherein the DSP provides a control signal in accordance with the predetermined DSP configuration to the control portion.

15. The configurable TX/RX device of claim 12 wherein a control signal in accordance with the predetermined DSP configuration is provided to the control portion from an external source.

16. The configurable TX/RX device of claim 12, wherein each of the N I/O connections is a differential I/O connection comprising two electrical connections.

17. The configurable TX/RX device of claim 12, wherein each of the N mux inputs are differential inputs and each of a respective N gate driver outputs are differential outputs.

18. The configurable TX/RX device of claim 12, wherein the PWM generator comprises between 1 and N PWM generator circuits in order to output 1 to N different PWM signals selectively to each one of the N gate drivers in accordance with the PWM control signal.

19. The configurable TX/RX device of claim 12, wherein the DSP predetermined configuration is one of a foreign object detection configuration and an object position determination configuration for an array of coils connected to the I/O connections.

20. The configurable TX/RX device of claim 12, wherein the DSP is further configured to determine a second voltage and phase of at least one of N AC input signals multiplexed through the N inputs of the analog multiplexer relative to a previously determined first voltage and phase of at one of the N AC input signals multiplexed through the N inputs of the analog multiplexer.

* * * * *